(12) United States Patent
Arkun et al.

(10) Patent No.: US 8,994,032 B2
(45) Date of Patent: Mar. 31, 2015

(54) III-N MATERIAL GROWN ON ERAIN BUFFER ON SI SUBSTRATE

(71) Applicants: Erdem Arkun, San Carlos, CA (US); Andrew Clark, Los Altos, CA (US); Rytis Dargis, Fremont, CA (US)

(72) Inventors: Erdem Arkun, San Carlos, CA (US); Andrew Clark, Los Altos, CA (US); Rytis Dargis, Fremont, CA (US)

(73) Assignee: Translucent, Inc., Palo Alto, CA (US)

( * ) Notice: Subject to any disclaimer, the term of this patent is extended or adjusted under 35 U.S.C. 154(b) by 0 days.

(21) Appl. No.: 13/784,568

(22) Filed: Mar. 4, 2013

(65) Prior Publication Data

US 2014/0246679 A1    Sep. 4, 2014

(51) Int. Cl.
| | |
|---|---|
| *H01L 29/36* | (2006.01) |
| *H01L 29/20* | (2006.01) |
| *H01L 21/02* | (2006.01) |
| *H01L 29/201* | (2006.01) |
| *H01L 29/207* | (2006.01) |
| H01L 29/778 | (2006.01) |

(52) U.S. Cl.
CPC ...... *H01L 29/2003* (2013.01); *H01L 21/02458* (2013.01); *H01L 21/02381* (2013.01); *H01L 21/02433* (2013.01); *H01L 21/02439* (2013.01); *H01L 21/0254* (2013.01); *H01L 21/0262* (2013.01); *H01L 29/201* (2013.01); *H01L 29/207* (2013.01); H01L 29/778 (2013.01)
USPC .............................. 257/76; 257/190; 438/478

(58) Field of Classification Search
CPC ................. H01L 21/02381; H01L 21/02433; H01L 21/02488; H01L 21/0254; H01L 21/0262; H01L 29/20; H01L 29/2003; H01L 29/207; H01L 29/66462; H01L 29/7787
USPC ......................................................... 257/194
See application file for complete search history.

(56) References Cited

U.S. PATENT DOCUMENTS

2005/0142391 A1*  6/2005  Dmitriev et al. .............. 428/698
2010/0308375 A1* 12/2010  Birkhahn ...................... 257/194

* cited by examiner

*Primary Examiner* — David Vu
*Assistant Examiner* — Jonathan Han
(74) *Attorney, Agent, or Firm* — Robert A. Parsons; Michael W. Goltry; Parsons & Goltry

(57) ABSTRACT

III-N material grown on a buffer on a silicon substrate includes a single crystal electrically insulating buffer positioned on a silicon substrate. The single crystal buffer includes rare earth aluminum nitride substantially crystal lattice matched to the surface of the silicon substrate, i.e. a lattice co-incidence between REAlN and Si better than a 5:4 ratio. A layer of single crystal III-N material is positioned on the surface of the buffer and substantially crystal lattice matched to the surface of the buffer.

10 Claims, 1 Drawing Sheet

III-N MATERIAL GROWN ON ERAIN BUFFER ON SI SUBSTRATE

FIELD OF THE INVENTION

This invention relates in general to the growth of III-N material on a silicon substrate and more specifically to the formation of an ErAlN buffer between the silicon substrate and a III-N layer.

BACKGROUND OF THE INVENTION

In the semiconductor industry, it is known that growing a III-N material, such as GaN, on a silicon substrate is difficult, due in large part to the large crystal lattice mismatch (−16.9%) and the thermal mismatch (53%) between silicon and GaN. Thus, some type of buffer layer or layers is generally formed on the silicon substrate and the III-N material is grown on the buffer layer. Generally, the prior art buffer layers are either, complicated and expensive to form or do not adequately reduce the strain in the GaN due to crystal lattice mismatch.

In the prior art, various attempts are disclosed for the growth of different devices including III-V materials on silicon and other substrates. An article entitled "Growth of Atomically smooth AlN films with a 5:4 Coincidence Interface" by Shenk et al. in *Materials Science and Engineering B*59 (1999) 84-87, describes a SAW (Surface Acoustic Wave) device on Si(111) a substrate. An article entitled "Growth and Optical Properties of Gadolinium Aluminum Nitride Thin Films" by Chen et al. in *Phys. Status Solidi* C9, No. 3-4, 1040-1042 (2012), describes the growth of $Gd_xAl_{1-x}N$ on silicon substrate (100) for the enhanced emission of UV luminescence at about 310 nm. In a U.S. Pub. 2010/0308375 entitled "Rare Earth Enhanced High Electron Mobility Transistor and Method for Fabricating Same", Birkham describes a device including an optional buffer of GaN, AlN, or ZnO. The buffer can be eliminated if the substrate is a "suitable native substrate" which III-V material can be grown directly on (no examples given). An insulator layer of intrinsic GaN deposited on the buffer is doped with a rare earth to improve the insulating qualities. An article entitled "Visible Cathodoluminescence of Er-doped Amorphous AlN Thin Films" by Guruvmurugan et al. in *Appl. Phys. Lett.* 74, 3008 (1999) describes the cathodoluminescence of erdium doped amorphous AlN. In all of these articles and publications the rare earth does not appear to be included for any deposition enhancement but for the optical qualities. Plus in the Guruvmurugan et al. article the material is amorphous so that no crystal matching is possible or required.

It would be highly advantageous, therefore, to remedy the foregoing and other deficiencies inherent in the prior art.

Accordingly, it is an object of the present invention to provide new and improved methods for the growth of single crystal III-N material on a silicon substrate.

It is another object of the present invention to provide new and improved methods for the growth of single crystal III-N material on a silicon substrate with reduced dislocation density and relatively simple to perform.

It is another object of the present invention to provide new and improved substantially stress free, single crystal III-N layers grown on a silicon substrate.

It is another object of the present invention to provide new and improved LED and/or HEMI devices formed on single crystal III-N layers with reduced dislocation density on a silicon substrate.

SUMMARY OF THE INVENTION

Briefly, the desired objects and aspects of the instant invention are realized in accordance with a III-N material grown on a buffer on a silicon substrate and includes a single crystal electrically insulating buffer positioned on a silicon substrate. The single crystal insulating buffer includes rare earth aluminum nitride (REAlN) having a lattice co-incidence between REAlN and Si better than a 5:4 ratio so that the buffer is substantially crystal lattice matched to the surface of the silicon substrate. A layer of single crystal III-N material is positioned on the surface of the insulating buffer and substantially crystal lattice matched to the surface of the buffer. The insulating buffer is engineered to reduced dislocation density in the single crystal III-N material. The engineering of the buffer includes providing an amount of rare earth metal in the buffer in an amount within a range of a doping level (lower end of the range) to a level of approximately 5%.

The desired objects and aspects of the instant invention are further achieved in accordance with a preferred method of growing III-N material on a silicon substrate including a step of providing a single crystal silicon substrate and epitaxially growing a single crystal electrically insulating buffer on the silicon substrate. The single crystal insulating buffer includes rare earth aluminum nitride (REAlN) and has a lattice co-incidence between REAlN and Si better than a 5:4 ratio so that the buffer is substantially crystal lattice matched to the surface of the silicon substrate. The method further includes a step of epitaxially growing a layer of single crystal III-N material on the surface of the buffer. The buffer is engineered to reduced dislocation density in the single crystal III-N material. The engineering of the buffer includes providing an amount of rare earth metal in the buffer in an amount within a range of a doping level (lower end of the range) to a level of approximately 5%.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
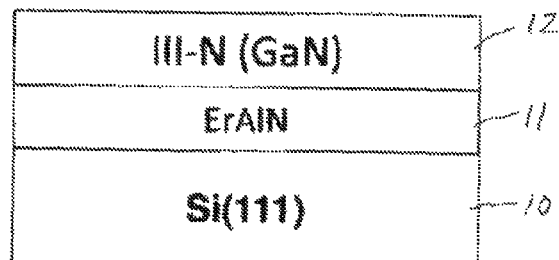
FIG. 1 is a simplified layer diagram illustrating a method of growing III-N material on a silicon substrate, in accordance with the present invention.

Turning to FIG. 1, a simplified layer diagram is illustrated representing several steps in a process of growing III-N material and in this preferred example GaN on a silicon substrate 10, in accordance with the present invention. It will be understood that substrate 10 is or may be a standard well known single crystal wafer or portion thereof generally known and used in the semiconductor industry. Also, the term "substrate" simply refers to a supporting structure and may be a layer of silicon-containing material positioned on a base layer of other material such as an oxide or the like. Single crystal substrates, it will be understood, are not limited to any specific crystal orientation but could include (111) silicon, or any other orientation or variation known and used in the art coming within the definition of Si(11n), where n>0. However, throughout this disclosure substrate 10 is illustrated with a preferred (111) orientation because of the simplification of further operations.

Silicon has a cubic crystal orientation and many other III-N materials, such as GaN, have a hexagonal crystal orientation. Epitaxially growing hexagonal crystals onto cubic crystals will generally generate huge lattice mismatch and a large dislocation density or crystal defects which will limit the usefulness of the material for device design. Further, because of the mismatch and subsequent dislocation density or defects, the thickness of a layer of III-N material is severely limited since the defects expand as the thickness becomes greater. Thus, it is difficult to grow single crystal GaN onto a single crystal silicon substrate since the different crystals of the two materials are difficult or impossible to lattice match.

Figure 2:
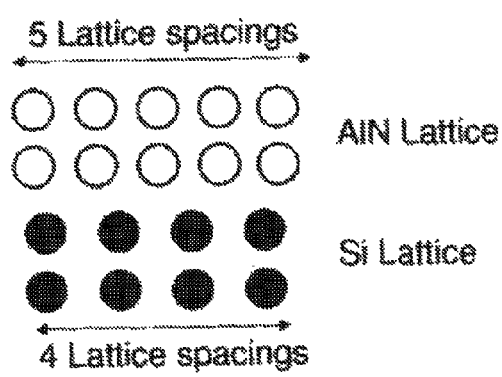
FIG. 2 is a simplified diagram illustrating the approximate crystal lattice match between Si and AlN.
Figure 3:
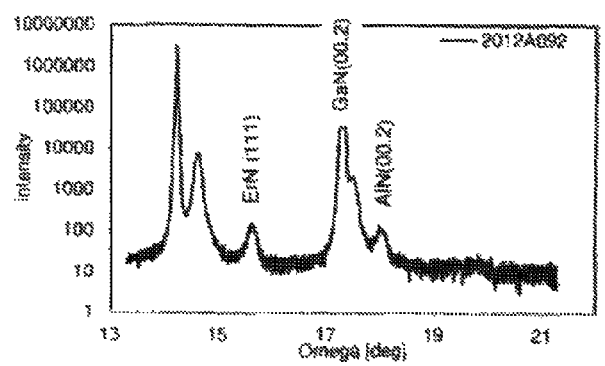
FIG. 3 is a graph illustrating XRD data for ErN and AlN.

In the present invention, as illustrated in FIG. 1, an electrically insulating buffer 11 of single crystal erbium-aluminum-nitride (ErAlN) is epitaxially grown on silicon substrate 10. While erbium is the preferred rare earth material, any rare earth material that crystallizes into a cubic form, such as any of the rare earths with a larger atomic number than gadolinium can be used. Single crystal erbium-aluminum-nitride (ErAlN) is epitaxially grown on silicon substrate 10 preferably by MBE but could instead be grown by MOCVD or any other technique, depending upon the specific application and additional growth techniques utilized. Further, the erbium in small amounts is a substitutional impurity in the AlN and will not change the crystal structure, it will however render the AlN electrically insulating and remedies conductive paths through the substrate that can result in device breakdown. The epitaxial growth of single crystal ErAlN buffer 11 is possible for the following reasons. As illustrated in FIG. 2, a 5:4 lattice co-incidence between AlN and Si has approximately a −1.2% misfit or mismatch leading to a reduced dislocation density. By adding Er into the AlN lattice the misfit can be fine tuned to achieve a better lattice spacing, i.e. a misfit less than approximately −1.2%. For purposes of this disclosure, the term "substantially lattice matched" is defined as a misfit lattice spacing of less than approximately −1.2%, i.e. the 5:4 ratio is improved. Generally, the Er concentration is in a range of a doping level (lower end of the range) to a level of approximately 5%. As can be seen with an additional reference to the graph of FIG. 3, ErN crystallizes into a cubic form and AlN crystallizes into a hexagonal form. However, ErAlN will preserve the hexagonal crystal structure for low concentrations of Er.

Thus, by varying the Er content of ErAlN buffer 11 the crystal lattice spacing can be substantially matched to silicon with very little strain. For purposes of this invention, the term "substantially crystal lattice matched" is defined as including a misfit less than approximately −1.2%. Further, by varying the composition of ErAlN buffer 11, a single crystal III-N layer 12 can be epitaxially grown on the upper surface thereof. Generally, the ErAlN closest to or adjacent silicon substrate 10 will have a larger Er component which adjusts the crystal spacing closest to the crystal spacing of silicon while ErAlN adjacent III-N layer 12 will have a smaller Er component. Also, depending upon the specific application, ErAlN buffer 11 can be formed with a single continuous composition or it can be graded, in linear, stepwise or any similar schemes.

It should be noted that ErAlN is impervious to MBE process gasses, i.e. $N_2$ plasma, $NH_3$ and metallic Ga, which is the preferred growth process in this invention. Also, in the event that other growth processes are used, such as the MOCVD process, the ErAlN is also impervious to MOCVD process gasses ($NH_3$, $H_2$, TMGa, etc.). Reaction of silicon with process gasses usually results in etching of silicon ($H_2$), formation of nitrides ($NH_3$), or severe reaction and blistering (Ga precursors). Thus silicon substrate 10 is protected from damage caused by generally all growth process gasses by ErAlN buffer 11.

A III-N material, in this specific example gallium nitride (GaN) layer 12, is epitaxially grown on ErAlN buffer 11 preferably by an MBE process. Because there may still be some strain in GaN layer 12, i.e. the crystal lattice junction with buffer 11 may still produce some strain, a thinner layer 12 of GaN is preferred. Generally, GaN layer 12 will be in a range of 50 nm to 100 nm thick, although thicker or thinner layers can be grown.

Figure 4:
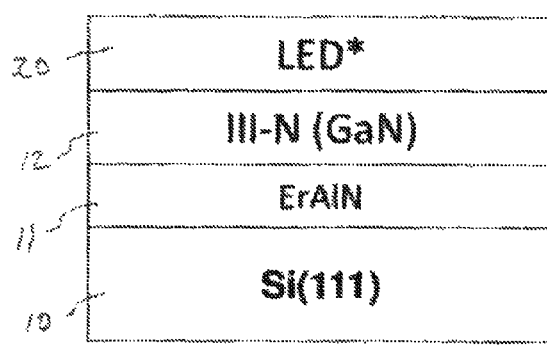
FIG. 4 is a simplified layer diagram of the III-N material on the silicon substrate of FIG. 1 with an LED structure formed thereon.

Turning to FIG. 4, ErAlN buffer 11 and GaN layer 12 are illustrated with a III-N LED structure 20 formed thereon. Structure 20 is illustrated as a single layer for convenience but it should be understood that III-N LED structure 20 includes the growth of one or more typical layers, including for example, i-GaN, n-GaN, active layers such as InGaN/GaN, electron blocking layers, p-GaN, and other inter-layers used in the formation and performance of LED (especially photonic LED) devices.

Figure 5:
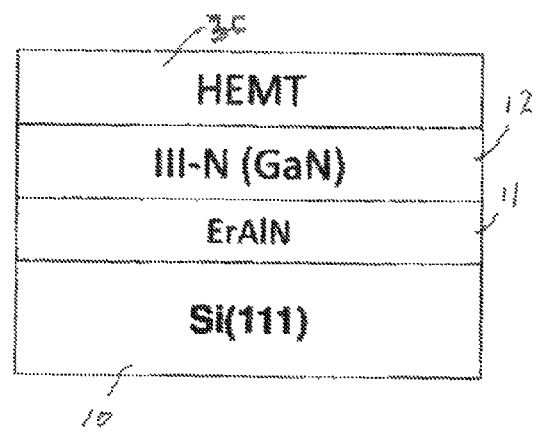
FIG. 5 is a simplified layer diagram of the III-N material on the silicon substrate of FIG. 1 with an HEMT structure formed thereon.

Turning to FIG. 5, ErAlN buffer 11, and GaN layer 12 are illustrated with an HEMT structure 30 formed thereon. Structure 30 is illustrated as a single layer for convenience but it should be understood that HEMT structure 30 includes the growth of one or more typical layers, including for example, i-GaN, AlN, AlGaN, GaN, and other inter-layers used in the formation and performance of HEMT devices.

Thus, new and improved methods for the growth of single crystal III-N material and new and improved devices grown on a silicon substrate are disclosed. The new and improved methods for the III-N material include the growth of a substantially crystal lattice matching single crystal ErAlN buffer on the silicon substrate with the Er content being varied to further reduce or engineer the strain leading to a reduced dislocation density. Also, the buffer eliminates or greatly reduces the problem of possibly damaging the silicon substrate with process gasses. New and improved LED and/or HEMT structures can be substantially lattice matched and thermally matched by the new process on a silicon substrate.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. III-N material grown on a buffer on a silicon substrate comprising:
   a single crystal silicon substrate;
   a single crystal electrically insulating buffer positioned directly on the silicon substrate in physical contact with the single crystal electrically insulating buffer, the single crystal buffer including rare earth aluminum nitride (REAlN), the single crystal buffer having a lattice co-incidence between REAlN and Si better than a 5:4 ratio so that the buffer is substantially crystal lattice matched to the surface of the silicon substrate; and a layer of single crystal III-N material positioned on the surface of the buffer.

2. The III-N material grown on the buffer on the silicon substrate as claimed in claim 1 wherein the rare earth aluminum nitride of the single crystal buffer includes erbium aluminum nitride.

3. The III-N material grown on the buffer on the silicon substrate as claimed in claim 2 wherein the erbium aluminum nitride includes erbium in a range of a doping level to approximately 5%.

4. The III-N material grown on the buffer on the silicon substrate as claimed in claim 3 wherein the erbium varies from a maximum amount adjacent the substrate to a minimum amount adjacent the layer of single crystal III-N material.

5. The III-N material grown on the buffer on the silicon substrate as claimed in claim 1 wherein the layer of single crystal III-N material includes GaN.

6. The III-N material grown on the buffer on the silicon substrate as claimed in claim 1 further including one of an LED structure and an HEMT structure formed on the layer of single crystal III-N material.

7. The III-N material grown on the buffer on the silicon substrate as claimed in claim 6 wherein the LED structure includes at least one layer of i-GaN, n-GaN, an active layer, an electron blocking layer, or p-GaN.

8. The III-N material grown on the buffer on the silicon substrate as claimed in claim 6 wherein the HEMT structure includes at least one layer of i-GaN, AlN, AlGaN, or GaN.

9. The III-N material grown on the buffer on the silicon substrate as claimed in claim 1 wherein the single crystal silicon substrate, the single crystal buffer and the layer of single crystal III-N material form a stack on a base material layer.

10. III-N material grown on a buffer on a silicon substrate comprising:

a single crystal silicon substrate with a (111) orientation;

a single crystal electrically insulating buffer positioned directly on the silicon substrate in physical contact with the single crystal electrically insulating buffer, the single crystal buffer including erbium aluminum nitride (ErAlN) with the amount of erbium being in a range of a doping level to approximately 5%, the single crystal buffer having a lattice co-incidence between ErAlN and Si better than a 5:4 ratio so that the buffer is substantially crystal lattice matched to the surface of the silicon substrate; and a layer of single crystal GaN material positioned on the surface of the buffer.

* * * * *